(12) United States Patent
Sekimura et al.

(10) Patent No.: US 8,262,933 B2
(45) Date of Patent: Sep. 11, 2012

(54) THERMOPLASTIC RESIN COMPOSITION, METHOD FOR PRODUCING THE SAME, AND MOLDED ARTICLE OBTAINED FROM THE SAME

(75) Inventors: Satoshi Sekimura, Nagareyama (JP); Hiroshi Harada, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 117 days.

(21) Appl. No.: 12/707,188

(22) Filed: Feb. 17, 2010

(65) Prior Publication Data
US 2010/0207064 A1  Aug. 19, 2010

(30) Foreign Application Priority Data
Feb. 19, 2009  (JP) ................................. 2009-036222

(51) Int. Cl.
| C09K 19/06 | (2006.01) |
| C08J 3/20 | (2006.01) |
| C08J 5/04 | (2006.01) |
| C08K 3/34 | (2006.01) |
| C08K 7/10 | (2006.01) |
| C08L 101/12 | (2006.01) |

(52) U.S. Cl. ............. 252/299.6; 252/299.01; 252/299.5; 523/220; 523/222; 523/351; 524/442; 524/456

(58) Field of Classification Search ............ 252/299.01, 252/299.5, 299.6; 523/351, 220, 222; 524/442, 524/456
See application file for complete search history.

(56) References Cited

U.S. PATENT DOCUMENTS

| 6,117,942 A | * | 9/2000 | Ogo et al. ........................ 525/66 |
| 7,138,453 B1 | * | 11/2006 | Suzuki et al. ................. 524/446 |
| 7,387,749 B2 | * | 6/2008 | Gulari et al. .............. 252/378 R |
| 7,758,773 B2 | * | 7/2010 | West et al. ............... 252/299.01 |
| 2007/0251275 A1 | * | 11/2007 | Bauer et al. ..................... 65/375 |

FOREIGN PATENT DOCUMENTS

| EP | 0633295 A1 | 1/1995 |
| JP | 10158527 A | 6/1998 |
| JP | 11060943 A | 3/1999 |
| JP | 11291277 A | 10/1999 |

* cited by examiner

*Primary Examiner* — Shean Wu
(74) *Attorney, Agent, or Firm* — Panitch Schwarze Belisario & Nadel LLP

(57) ABSTRACT

The present invention provides a thermoplastic resin composition comprising a thermoplastic resin and aggregated particles of fibrous crystals. According to the thermoplastic resin composition, a molded articles which adequately reduce a defect in appearance can be obtained.

7 Claims, 1 Drawing Sheet

External Dimensions: 64 × 64 × 3 mm

Hollow Diameter: φ 6mm

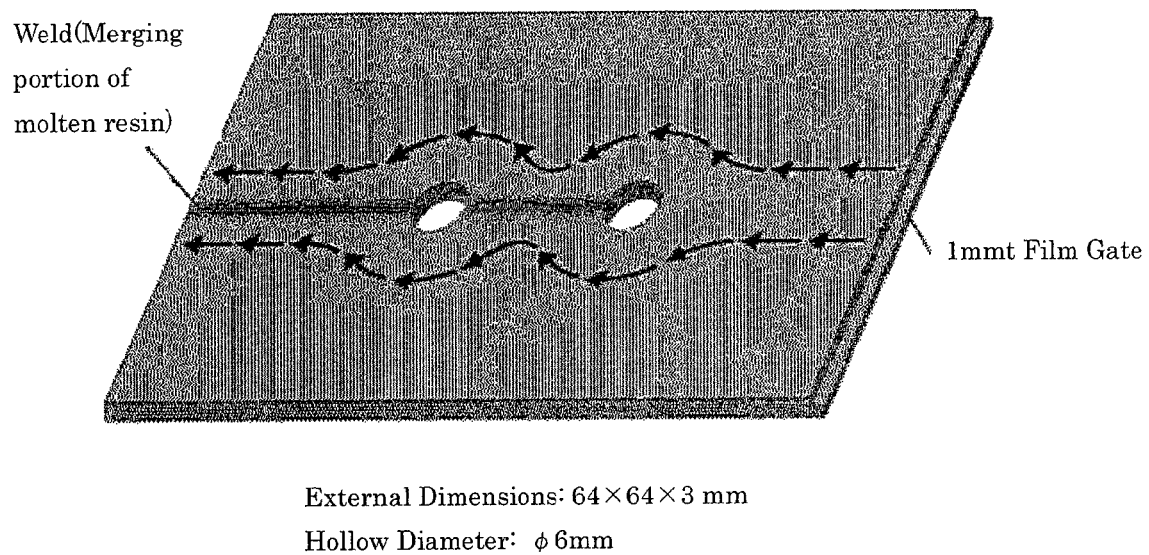

THERMOPLASTIC RESIN COMPOSITION, METHOD FOR PRODUCING THE SAME, AND MOLDED ARTICLE OBTAINED FROM THE SAME

BACKGROUND OF THE INVENTION

1. Field of the Invention

The present invention relates to a thermoplastic resin composition comprising aggregated particles and a thermoplastic resin, a method for producing the thermoplastic resin composition, and a molded article obtained by melt-molding the thermoplastic resin composition.

2. Description of the Related Art

Thermoplastic reins can be recycled and applied to processing of melt-molding with high productivity (extrusion molding, injection molding, etc.), and thus useful as environmentally friendly and energy-sufficient materials. Above all, high-performance polymer materials (engineering materials) which can replace metals and ceramics have been used as constituent materials in various fields such as an electricity, electronics, mechanics, optical instruments, automobiles, aircraft, and medical fields.

Among thermoplastic resins, liquid crystal polymers provide molded articles which have excellent properties such as mechanical strength and heat resistance, and are thus useful particularly for constituent materials in a variety of fields. The liquid crystal polymers have rigid molecules, thus form polydomains in a liquid crystal state without entanglement even in a molten state, and behave with molecular chains substantially oriented in the flow direction due to shearing during molding, thereby allowing molded articles with excellent mechanical strength to be obtained.

Meanwhile, in the case of melt-molding a thermoplastic resin to obtain a molded article, a molding method referred to as injection molding is normally used when a molded article in a relatively complex shape is to be obtained. This injection molding is a method in which, with a mold having a void (cavity) corresponding to a desired shape for the molded article, a molten resin is injection molded into the cavity, the molten resin injected is further subjected to cooling solidification, followed by separation of the mold, thereby producing a molded article. In the production of a molded article through injection molding, when the molded article intended has a shape, for example, with a hollow portion, in the cavity, the molten resin injected may divide into multiple flow channels or the molten resin divided may further merge again. Then, the portion where the molten resin has merged may provide color unevenness or concave in a molded article to be obtained, resulting in a defect in appearance (defective appearance). This defective appearance of the molded article is normally referred to as a weld line.

In order to improve the defective appearance of the molded article, it is necessary to reduce generation of the weld line, and various ideas have been thus tried during melt-molding. For example, Japanese Patent Application Laid-Open No. 11-291277 discloses that the weld line can be reduced by providing a thick-walled portion around a through hole (hollow portion) in a molded article with the through hole formed in a plate-shaped main body portion. However, this consideration will limit the shape of the molded article, and may fail to conform to the intended use of the molded article.

SUMMARY OF THE INVENTION

For melt-molding a thermoplastic resin to obtain a molded article, it is important to reduce a generation of the prevent weld line in order to obtain a high-quality molded article. Therefore, resin materials which can provide molded articles with less weld lines while still ensuring the degree of freedom in molded article shape have also been demanded by the market. In particular, in the case of using a liquid crystal polymer as the thermoplastic resin, the liquid crystal polymer is likely to develop a weld line more clearly due to its strong orientation during molding when a molded article is to be manufactured which causes merging of a molten resin in the cavity, and in particular, has the disadvantage of a poor appearance.

Therefore, one of objective of the present invention is to provide a resin material (thermoplastic resin composition) which provides a molded article which adequately reduces weld lines and has an excellent appearance when a thermoplastic resin, in particular, a liquid crystal resin is melded and molded (injection-molded).

The present inventors have earnestly studied in order to solve the problem described above, resulting in the achievement of the present invention. Namely, the present invention provides a thermoplastic resin composition comprising a thermoplastic resin and aggregated particles of fibrous, crystals. Also, the present invention provides a preferable method for producing the thermoplastic resin composition. Further, the present invention provides a molded article obtained by melt-molding the thermoplastic resin composition.

According to the thermoplastic resin composition of the present invention, molded articles which adequately reduce a generation of the weld line can be obtained. In particular, when the thermoplastic resin is a liquid crystal polymer, weld lines can be successfully reduced as compared to conventional molded articles. Molded articles obtained with the use of the thermoplastic resin composition according to the present invention are quite useful for particularly appearance-critical molded articles such as cases and housings, and for optical components such as lens tubes of cameras and optical sensor housings, in which uneven reflection at the surface is problematic, and thus have great industrial value.

BRIEF DESCRIPTION OF THE DRAWINGS

FIG. 1 is a diagram schematically illustrating the shape of a molded article used for the determination of the presence or absence of a weld line in examples.

DETAILED DESCRIPTION OF THE INVENTION

The present invention provides a thermoplastic resin composition including:
a thermoplastic resin; and
aggregated particles obtained by aggregation of fibrous crystals. The aggregated particles and thermoplastic resin as constituents of the thermoplastic resin composition, a method for producing a thermoplastic resin composition with the use of these constituents, and a molded article obtained by melt-molding the thermoplastic resin composition will be sequentially described below.

<Aggregated Particles>

The aggregated particles used in the present invention are preferably particles obtained by aggregation of fibrous crystals with a fiber length of 0.05 μm to 30 μm. The fibrous crystals more preferably have a fiber length in the range of 0.1 to 10 μm. Furthermore, it is preferable that the fibrous crystals have a fiber size of 10 nm to 1 μm, and more preferably 50 nm to 600 nm. The fiber length and fiber size used herein are obtained by a measuring method as described below. Fibrous crystals with such a fiber size tend to produce favorable affinity with the thermoplastic resin.

[Method for Measuring Fiber Length and Fiber Size]

The fibrous crystals are dispersed in methanol to prepare a dispersion, the dispersion is placed on a glass slide, evaporation of the methanol is followed by micrographing the fibrous crystals with the use of a scanning electron microscope at 2000-fold magnification, and the fiber lengths of the fibrous crystals are measured from the micrograph. This micrograph is used to measure the fiber lengths of approximately 100 of the fibrous crystals, and the measured values are subjected to averaging to obtain an average fiber length. Furthermore, a micrograph obtained in the same way is used to measure the fiber sizes of the fibrous crystals, and obtain about the same number of measured values as that in the measurement of the fiber lengths, and the measured values are subjected to averaging to obtain an average fiber size.

The fibrous crystals used in the present invention may be typically crystals in the form of fibers which may contain silicate as components thereof and may be produced artificially. Examples of the fibrous crystals include fibrous crystals containing silicate such as calcium silicate, magnesium silicate, sodium silicate or potassium silicate. Among them, the calcium silicate fibrous crystals are preferably utilized. The aggregated particles composed of such fibrous crystals tend to produce more favorable affinity with the thermoplastic resin.

Specific examples of the calcium silicate fibrous crystals include crystals of Tobermorite (chemical formula: $Ca_5Si_6O_{16}(OH)_2 \cdot 4H_2O$), crystals of Wollastonite (chemical formula: $CaO \cdot SiO_2$), and crystals of Xonotlite (chemical formula: $CaO \cdot SiO_2 \cdot H_2O$).

The Wollastonite is available from, for example, Tomoe Engineering Co., Ltd., Nagase Chemspec. Co., Ltd. etc., as crystals with a fiber length of about 6 to 25 µm.

The Xonotlite is available from, for example, Ube Materials Industries, Ltd., etc., as crystals with a fiber length of about 10 to 20 µm.

The aggregated particles are obtained from these fibrous crystals. In other words, the aggregated particles used in the present invention can be referred to as secondary particles obtained by aggregation of the fibrous crystals.

In order to obtain the aggregated particles obtained by aggregation of the fibrous crystals, a variety of known means is employed. Specifically, as examples of prior literatures, Japanese Patent Application Laid-Open No. 6-40715 discloses a method in which milk of lime, a crystalline silicate raw material, and water are prepared and mixed to obtain a raw material slurry, a hydrothermal synthesis reaction is allowed to carry out with the raw material slurry pressurized, while stirring with heating, thereby obtaining aggregated particles obtained by aggregation of Tobermorite. Furthermore, Japanese Patent Application Laid-Open No. 53-146997 discloses a method for producing aggregated particles derived from aggregation of Wollastonite.

Moreover, aggregated particles derived from aggregation of Xonotlite crystals also includes commercial products easily available from the market. The commercial products include, for example, "Xonotlite Powder XK" (mean particle size: 30 µm) and "Xonotlite Powder XJ" (mean particle size: 22 µm) manufactured by Japan Insulation Co., Ltd. While such commercial aggregated particles have been put on the market for applications of building materials such as fire-resistant materials, thermal insulations, and materials for designs, studies of the present inventors have found for the first time that a thermoplastic resin composition obtained by such commercial aggregated particles together with a thermoplastic resin can prevent a molded article obtained from the thermoplastic resin composition from causing weld lines. The mean particle size used herein refers to a "volume average particle size" obtained by laser diffraction grain size distribution measurement. The use of such commercial aggregated particles eliminates the need for production of the aggregated particles, and thus has the advantage that a step in the production of the thermoplastic resin according to the present invention can be omitted.

Furthermore, the aggregated particles used in the present invention are not always be spherical or substantially spherical in shape. The aggregated particles may be deformed particles, or the aggregated particles with some of their surfaces uneven. Moreover, for the purpose of achieving more favorable miscibility when the aggregated particles are melt and kneaded together with the thermoplastic resin described later, the aggregated particles preferably have a mean particle size in the range of 1 to 100 µm, more preferably in the range of 10 to 50 µm, and even more preferably in the range of 20 to 40 µm. If fibrous crystals are aggregated to produce aggregated particles by the method described above, and the obtained aggregated particles then fail to satisfy this mean particle size, the aggregated particles can also be classified by appropriate classification to regulate the aggregated particles to a desired mean particle size. The aggregated particles obtained by aggregation of Xonotlite fibrous crystals also have a mean particle size in a preferred range.

<Thermoplastic Polymer>

A variety of thermoplastic resins which will cause weld lines in melt-molding can be applied to the thermoplastic composition according to the present invention. Specific examples of the thermoplastic resin includes polystyrene, polymethylpentene-1, polyethylene, polypropylene, polyamide 12, an acrylonitrile-butadiene-styrene copolymer, an acrylonitrile-ethylene-propylene-styrene copolymer, polyamide 6, polyamide 66, aromatic polyamide, 9T polyamide, polyacetal, polymethyl methacrylate, poly(vinylidene fluoride), poly(vinyl fluoride), poly(ethylene-propylene hexafluoride), poly(ethylene trifluoride), poly(ethylene-tetrafluoroethylene), polyacrylonitrile, polyacrylate, polyethylene telephthalate, polybutylene telephthalate, polyphenylenesulfide, polycarbonate, polyetherketone, polyetheretherketone, polyetherimide, polysulfone-polyethersulfone, polyester, polyethylene telephtalate, an polyphenylene oxide and modifications thereof, polysulfone, polyarylate, and polyesteramide. Furthermore, among these examples, liquid crystal polymers such as liquid crystalline polyester, polyamide, or polyesteramide are likely to cause weld lines more clearly as already described, and thus can further obtain the advantageous effects of the present invention.

<Liquid Crystal Polymer>

Liquid crystal polymers preferred for use in the present invention will be described in detail below.

The liquid crystal polymer refers to a polymer which exhibits optical anisotropy while melting and forms an anisotropic melt at a temperature of 500° C. or less. This optical anisotropy can be confirmed by a normal polarization test using an orthogonal polarizer. The liquid crystal polymer has, in the molecule, a molecular chain which has an elongate molecular shape and has flatness and is rigid along the long chain of the molecule (hereinafter, a rigid molecular chain may be referred to as a "mesogenic group"). While the liquid crystal polymer is a polymer which has such a mesogenic group in either one or both of its main chain and side chain, a liquid crystal polymer which has a mesogenic group in the main chain of the polymer is preferable for the thermoplastic resin composition according to the present invention if a higher heat-resistance molded article is desired.

Specific Examples of the liquid crystal polymer include liquid crystal polyester, liquid crystal polyesteramide, liquid crystal polyester ether, liquid crystal polyester rbonate, liquid crystal polyesterimide, and liquid crystal polyamide, and among these examples, liquid crystal polyester, liquid crystal polyester amide, or liquid crystal polyamide is preferable in that a high-strength molded article is obtained.

To give specific examples of the preferred liquid crystal polymers described above, at lease one liquid crystal polymer selected from the group consisting of the following (a), (b), and (c) is preferable:

(a) liquid crystal polyester, liquid crystal polyesteramide, or liquid crystal polyamide composed of a structural unit (I) and/or a structural unit (II);

(b) liquid crystal polyester or liquid crystal polyesteramide composed of
a structural unit selected from the group consisting of the structural unit (I) and the structural unit (II),
a structural unit (III), and
a structural unit (IV); and (c) liquid crystal polyester or liquid crystal polyesteramide composed of
a structural unit selected from the group consisting of the structural unit (I) and the structural unit (II),
the structural unit (III), and
a structural unit selected from the group consisting of the structural unit (VI), a structural unit (V), and a structural unit (VI),

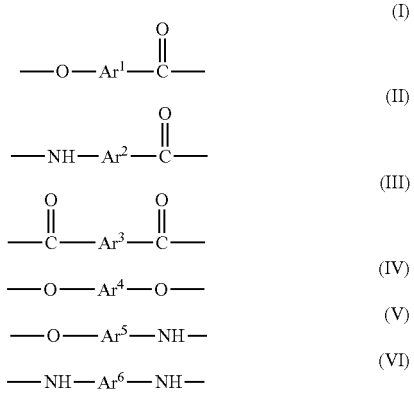

where $Ar^1$, $Ar^2$, $Ar^5$, and $Ar^6$ are identical or different, and represent a divalent aromatic group, and $Ar^3$ and $Ar^4$ are identical or different, and represent a group selected from the group consisting of a divalent aromatic group, a divalent alicyclic group, and a divalent aliphatic group. Here, some or all of hydrogen atoms on aromatic rings of the aromatic groups may be substituted with a halogen atom, an alkyl group having 1 to 10 carbon atoms, an alkoxy group having 1 to 10 carbon atoms, or an aryl group having 6 to 10 carbon atoms. The alicyclic group refers to a group obtained by removing two hydrogen atoms from an alicyclic compound, and the aliphatic group refers to a group obtained by removing two hydrogen atoms from an aliphatic compound.

In the structural unit mentioned above, aromatic groups represented by $Ar^1$, $Ar^2$, $Ar^5$, and $Ar^6$ are a group obtained by removing two hydrogen atoms bonded to aromatic rings of an aromatic compound selected from the group consisting of monocyclic aromatic compounds, condensed ring aromatic compounds, and aromatic compounds in which multiple aromatic rings are linked by a divalent linking group (including single bonds), such as benzene, naphthalene, biphenylene, diphenyl ether, diphenyl sulfone, diphenyl ketone, diphenyl sulfide and diphenyl methane, preferably a divalent aromatic group selected from the group consisting of a 2,2-diphenyl propylidene group, a 1,4-phenylene group, a 1,3-phenylene group, a 2,6-naphthalenediyl group, and a 4,4-biphenylene group, and a liquid crystal polymer with such a group as the aromatic group is preferable because the liquid crystal polymer tends to be more excellent in mechanical strength.

The structural unit (I) is a structural unit derived from an aromatic hydroxycarboxylic acid, and the aromatic hydroxycarboxylic acid includes 4-hydroxy benzoic acid, 3-hydroxy benzoic acid, 6-hydroxy-2-naphthoic acid, 7-hydroxy-2-naphthoic acid, 6-hydroxy-1-naphthoic acid, 4'-hydroxybiphenyl-4-carboxylic acid, or aromatic hydroxycarboxylic acids in which some or all of hydrogen atoms on aromatic rings of the aromatic hydroxycarboxylic acids are substituted with an alkyl group, an alkoxy group, or a halogen atom. The alkyl group includes straight-chain, branched, or alicyclic alkyl groups having 1 to 6 carbon atoms such as a methyl group, an ethyl group, a propyl group, an isopropyl group, a butyl group, a tert-butyl group, a hexyl group, and a cyclohexyl group. The alkoxy group includes straight-chain, branched, or alicyclic alkoxy groups such as a methoxy group, an ethoxy group, a propyoxy group, an isopropyoxy group, a butoxy group, a tert-butoxy group, a hexyloxy group, and a cyclohexyloxy group. The aryl group includes a phenyl group and a naphthyl group. Furthermore, the halogen atom is a fluorine atom, a chlorine atom, a bromine atom, or an iodine atom.

The structural unit (II) is a structural unit derived from an aromatic aminocarboxylic acid, and the aromatic aminocarboxylic acid includes 4-aminobenzoic acid, 3-aminobenzoic acid, 6-amino-2-naphthoic acid, or aromatic aminocarboxylic acids in which some or all of hydrogen atoms on aromatic rings of the aromatic aminocarboxylic acids are substituted with an alkyl group, an alkoxy group, an aryl group or a halogen atom. Examples of the alkyl group, the alkoxy group, the aryl group, and the halogen atom are the same as the examples of the substituents for the aromatic hydroxycarboxylic acid described above.

The structural unit (V) is a structural unit derived from an aromatic hydroxyamine, which includes 4-aminophenol, 3-aminophenol, 4-amino-1-naphthol, 4-amino-4'-hydroxydiphenyl, or aromatic hydroxyamines in which some or all of hydrogen atoms on aromatic rings of the aromatic hydroxyamines are substituted with an alkyl group, an alkoxy group, an aryl group or a halogen atom. Examples of the alkyl group, the alkoxy group, the aryl group, and the halogen atom are the same as the examples of the substituents for the aromatic hydroxycarboxylic acid described above.

The structural unit (VI) is a structural unit derived from an aromatic diamine, which includes 1,4-phenylenediamine, 1,3-phenylenediamine, 4,4'-diaminophenylsulfide(thiodianiline), 4,4'-diaminodiphenylsulfone, 4,4'-diaminodiphenylether(oxydianiline), or aromatic diamines in which some or all of hydrogen atoms on aromatic rings of the aromatic diamines are substituted with an alkyl group, an alkoxy group, an aryl group or a halogen atom, and aromatic diamines in which hydrogen atoms bounded to primary amino groups of the aromatic diamines given above as examples are substituted with an alkyl group. Examples of the alkyl group, the alkoxy group, the aryl group, and the halogen atom are the same as the examples of the substituents for the aromatic hydroxycarboxylic acid described above.

The Ar³ in the structural unit (III) and the Ar⁴ in the structural unit (IV) re groups selected from divalent aliphatic groups and divalent alicyclic groups obtained by removing two hydrogen atoms from saturated aliphatic compounds having 1 to 9 carbon atoms, in addition to the aromatic groups described for the Ar¹, Ar², Ar⁵, and Ar⁶.

The structural unit (III) is a group derived from an aromatic dicarboxylic acid or an aliphatic dicarboxylic acid, and the aromatic dicarboxylic acid includes terephthalic acid, 4,4'-diphenyl dicarboxylic acid, 4,4"-triphenyl dicarboxylic acid, 2,6-naphthalene dicarboxylic acid, diphenylether-4,4'-dicarboxylic acid, isophthalic acid, diphenylether-3,3'-dicarboxylic acid, or aromatic dicarboxylic acids in which some or all of hydrogen atoms on aromatic rings of the aromatic dicarboxylic acids are substituted with an alkyl group, an alkoxy group, an aryl group or a halogen atom.

The aliphatic dicarboxylic acid includes aliphatic dicarboxylic acids such as malonic acid, succinic acid, adipic acid, trans-1,4-cyclohexane dicarboxylic acid, cis-1,4-cyclohexane dicarboxylic acid and 1,3-cyclohexane dicarboxylic acid; trans-1,4-(1-methyl)cyclohexane dicarboxylic acid, trans-1,4-cyclohexane dicarboxylic acid, or aliphatic dicarboxylic acids in which some or all of hydrogen atoms on aliphatic groups or alicyclic groups of the aliphatic dicarboxylic acids are substituted with an alkyl group, an alkoxy group, an aryl group or a halogen atom.

Examples of the alkyl group, the alkoxy group, the aryl group, and the halogen atom are the same as the examples of the substituents for the aromatic hydroxycarboxylic acid described above.

The structural unit (IV) is a group derived from an aromatic diol or an aliphatic diol, and the aromatic diol includes hydroquinone, resorcin, naphthalene-2,6-diol, 4,4'-biphenylene diol, 3,3'-biphenylene diol, 4,4'-dihydroxy diphenyl ether, 4,4'-dihydroxy diphenyl sulfone or aromatic diols in which some or all of hydrogen atoms on aromatic rings of the aromatic diols are substituted with an alkyl group, an alkoxy group, an aryl group or a halogen atom.

The aliphatic diol includes ethylene glycol, propylene glycol, butylene diol, neopentyl glycol, 1,6-hexanediol, trans-1,4-cyclohexanediol, cis-1,4-cyclohexanediol, trans-1,4-cyclohexanedimethanol, cis-1,4-cyclohexanedimethanol, trans-1,3-cyclohexanediol, cis-1,2-cyclohexanediol, trans-1,3-cyclohexanedimethanol, or aliphatic diols in which some or all of hydrogen atoms on aliphatic groups or alicyclic groups of the aliphatic diols are substituted with an alkyl group, an alkoxy group, or a halogen atom.

Examples of the alkyl group, the alkoxy group, the aryl group, and the halogen atom are the same as the examples of the substituents for the aromatic hydroxycarboxylic acid described above.

In the preferred liquid crystal polymers mentioned above, (b) or (c) may have an aliphatic group in the structural unit (III) and the structural unit (IV), and the amount of the aliphatic group introduced to such a liquid crystal polymer is selected in a range where the liquid crystal polymer can exert liquid crystallinity, and further selected in a range where the heat resistance of the liquid crystal polymer is not significantly damaged. In the liquid crystal polymer to be applied to the present invention, the total amount of the divalent aromatic groups is preferably 60 mol % or more, further preferably 75 mol %, and more preferably 90 mol %, when the total amount of the aromatic groups Ar¹ to Ar⁶ in the liquid crystal polymer is made 100 mol %, and entirely aromatic liquid crystal polymers in which the total amount of the divalent aromatic groups is 100 mol % are particularly preferable.

Among preferred entirely aromatic liquid crystal polymers, liquid crystal polyesters of (a) or liquid crystal polyesters of (b) are preferable, and in particular, the liquid crystal polyesters of (b) are preferable. Further, among the liquid crystal polyesters of (b), a liquid crystal polyester composed of:

a structural unit derived from an aromatic hydroxycarboxylic acid of the following (I-1) and/or (I-2);

a structural unit derived from at least one aromatic dicarboxylic acid selected from the group consisting of the following (III-1), (III-2), and (III-3); and a structural unit derived from at least one aromatic diol selected from the group consisting of the following (IV-1), (IV-2), (IV-3) and (IV-4), has the advantage that a molded article is easily obtained which keeps high levels for all of properties such as moldability, heat resistance, mechanical strength, and flame retardancy.

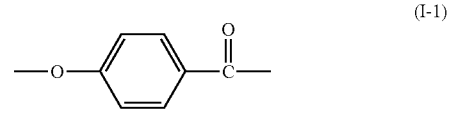

(I-1)

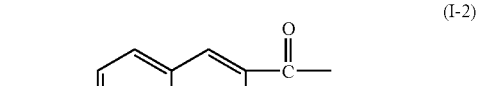

(I-2)

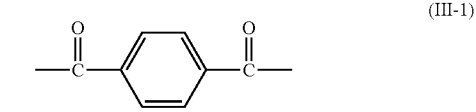

(III-1)

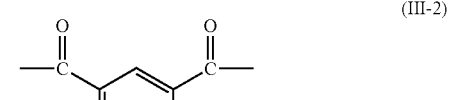

(III-2)

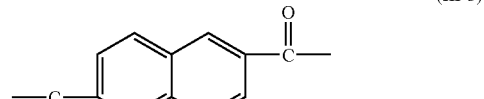

(III-3)

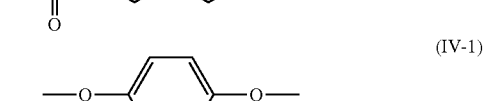

(IV-1)

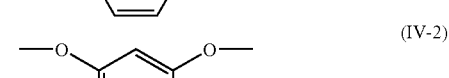

(IV-2)

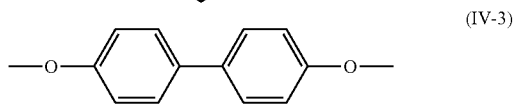

(IV-3)

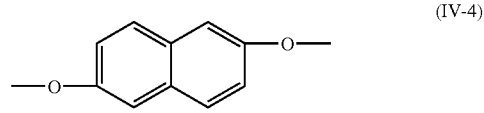

(IV-4)

Next, a method for producing a preferred liquid crystal polymer will be described.

As a method for producing the liquid crystal polymer, the liquid crystal polymer can be produced by:

in the case of (a), providing an aromatic hydroxycarboxylic acid and/or an aromatic aminocarboxylic acid as raw material monomers;

in the case of (b), providing an aromatic hydroxycarboxylic acid and/or an aromatic aminocarboxylic acid, an aromatic dicarboxylic acid and/or an aliphatic dicarboxylic acid, and an aromatic diol and/or an aliphatic diol as raw material monomers; and in the case of (c), providing an aromatic carboxylic acid and/or an aromatic aminocarboxylic acid, an aromatic dicarboxylic acid and/or an aliphatic dicarboxylic acid, and at least one compound selected from the group consisting of an aromatic diol, an aliphatic diol, an aromatic hydroxyamine, and an aromatic diamine, as raw material monomers, and polymerizing these raw material monomers in accordance with a known polymerization method.

In the liquid crystal polyester of (b), which is more preferred liquid crystal polymer, a liquid crystal polyester can be obtained by polymerization of an aromatic hydroxycarboxylic acid, an aromatic dicarboxylic acid, and an aromatic diol used as raw material monomers.

As described above, in order to produce the liquid crystal polymer, the raw material monomers mentioned above may be directly polymerized. However, in order to further facilitate the polymerization, it is preferable to convert some of the raw material monomers to an ester forming derivative/an amide forming derivative (hereinafter may be collectively referred to as an "ester/amide forming derivative"), followed by polymerization. The ester/amide forming derivative refers to a compound having a group which promotes an ester production reaction or an amide production reaction, and specific examples of the ester/amide forming derivative include an ester/amide forming derivative obtained by converting a carboxylic group in a monomer molecule to a haloformyl group, an acid anhydride group or an ester group, and an ester/amide forming derivative obtained by converting a phenolic hydroxyl group or a phenolic amino group in a monomer molecule to an ester group or an amide group, respectively.

A method will be briefly described below, in which some of the raw material monomers are converted to an ester/amide forming derivative, followed by polymerization to produce the liquid crystal polyester of (b). The production of the liquid crystal polyester can be carried out in accordance with, for example, a method described in Japanese Patent Application Laid-Open No. 2002-146003. First, an aliphatic acid anhydride, preferably acetic anhydride is used to produce acylated products in which phenolic hydroxyl groups of an aromatic hydroxycarboxylic acid and an aromatic diol have been converted to acyl groups. Then, polycondensation through decarboxylation is developed in such a way that the acyl groups of the thus obtained acylated products and the carboxylic groups of the acylated aromatic hydroxycarboxylic acid and an aromatic dicarboxylic acid produce transesterification, thereby producing a liquid crystal polyester. This polycondensation through decarboxylation can be carried out by melt polymerization under polymerization conditions of the reaction temperature from 150 to 400° C. and the reaction time from 0.5 to 8 hours. The melt polymerization provides a liquid crystal polyester which has a relatively low molecular weight (hereinafter, referred to as a "prepolymer"). In order to further improve the properties of the liquid crystal polyester itself, it is preferable to provide the prepolymer with a higher molecular weight, and it is preferable to carry out solid phase polymerization for the higher molecular weight. The solid phase polymerization is a polymerization method in which the prepolymer is ground into powder, and the obtained powdered prepolymer is heated while remaining in a solid phase state. The use of this solid phase polymerization promotes the polymerization, thereby allowing the liquid crystal polyester to have a higher molecular weight.

<Thermoplastic Resin Composition>

The thermoplastic resin composition according to the present invention may contain the aggregated particles described above in the amount of from at 0.1 part by weight to 150 parts by weight, preferably in the amount of 0.5 part by weight to 67 parts by weight, more preferably in the amount of from 1 part by weight to 25 parts by weight, with respect to 100 parts by weight of the thermoplastic resin described above. The usage of the aggregated particles below the range may fail to adequately avoid a generation of the weld line in a molded article to be obtained. On the other hand, the usage of the aggregated particles greater than the range tends to easily deteriorate the moldability of the thermoplastic resin composition, and also decrease the mechanical strength of the molded article to be obtained, resulting in fragility of the molded article.

The thermoplastic resin composition of the present invention can be prepared by a variety of conventional methods. For example, the thermoplastic resin composition may be obtained by mixing a thermoplastic resin and aggregated particles with a Henschel mixer, a tumbler, or the like. Alternatively, a thermoplastic resin composition in the shape of pellet (composition pellet) can be obtained by heating a thermoplastic resin so as to be melt in advance with an extruder, adding aggregated particles thereto, and then melting, kneading and extruding the resulting mixture so as to be molded. Alternatively, these methods may be combined to obtain a thermoplastic resin composition of the present invention. For example, a thermoplastic resin composition in the shape of pellet (composition pellet) can be obtained by mixing a thermoplastic resin and aggregated particles in advance with a Henschel mixer, a tumbler or the like, and then melting, kneading and extruding the resulting mixture so as to be molded with the extruder. Although a method of the thermoplastic resin composition of the present invention is not limited, the thermoplastic resin composition is preferably produced using an extruder so as to have a shape of pellet as a composition pellet. This is because the composition pellet is excellent in handleability when used for subsequent molding. It is more preferable to use a twin-screw kneading extruder as the extruder.

As described above, a thermoplastic resin composition (especially, a pellet thereof) in the present invention can be produced by mixing all the amount of the molten thermoplastic rein to be used with the amount of the aggregated particles to be used at once so that the resulting mixture may be kneaded and extruded. However, preferably, a thermoplastic resin composition in the present invention is produced by a method comprising the steps of:

mixing a thermoplastic resin with a partial aggregated particles of fibrous crystals to obtain a mixture;

adding the rest of the aggregated particles to the mixture; and melting, kneading and extruding the resulting mixture to provide the thermoplastic resin composition.

In this method, the melting matter obtained from the step of melting and kneading is molded into strips (strand), and the strand is cut to have a certain length to provide a composition pellet. When the thermoplastic resin to be used is also divided and used separately more than once to provide a thermoplastic resin composition in the shape of pellet, the aggregated particles in the thermoplastic resin composition (composition pellet) in the shape of pellet advantageously tens to be dispersed more uniformly (to have more favorable dispersibility). Further, in this case, it is preferable to use the aggregated particles in advance for the preparation of the mixture in the amount of from 10 to 50% by weight, more preferably in the amount of about 30% by weight, with respect to its total usage. For reference, the dispersibility of the aggregated particles in the thermoplastic resin composition can be confirmed by a method in which a weight of the composition pellet cut into a predetermined length is measured, and the variation in the measured weight is obtained from the standard deviation of the measure weight. When the measured weight has a small variation, the dispersibility can be considered favorable.

Other fillers may be used for the thermoplastic resin composition according to the present invention as long as the effects of the present invention are not deteriorated, in order to improve other properties, for example, mechanical strength, etc. Such fillers include fibrous fillers, plate fillers, spherical fillers, powder fillers, irregular shaped fillers, whiskers, coloring components, lubricants, various types of surfactants, antioxidants and thermal stabilizers, and further, various types of stabilizers, ultraviolet absorbing agents, and antistatic agents.

The fibrous fillers include, for example, glass fibers, PAN-based carbon fibers, pitch-based carbon fibers, silica-alumina fibers, silica fibers, and alumina fibers.

The plate fillers include, for example, talc, mica, and graphite.

The spherical fillers include glass beads and glass balloons.

The powder fillers include calcium carbonate, dolomite, clay barium sulfate, titanium oxide, carbon black, conductive carbon, and fine silica.

The irregular shaped fillers include glass flakes and modified cross-section glass fibers.

One of these fillers may be used, or two or more of these fillers may be used in combination. The usage thereof is preferably 0 to 250 parts by weight, more preferably 0 to 150 parts by weight, further preferably 0 to 100 parts by weight, and even more preferably 0 to 67 parts by weight, with respect to 100 parts by weight of the thermoplastic resin.

Further, in a case where carbon black is used as the filler for the thermoplastic resin composition according to the present invention, the presence or absence of a weld line caused in a molded article obtained can be clearly determined. The use of the carbon black provides a molded article colored in black. Then, when the molded article has a weld line caused, a variation will occur in degree of coloring. Thus, when the presence or absence of the variation is determined as described above, the presence or absence of weld lines can be determined.

<Molding Method for Thermoplastic Resin Composition>

The thermoplastic resin compositions according to the present invention exert a striking advantageous effect such that a generation of the weld line can be reduced quite successfully in conventionally known melt molding, preferably, injection molding which is highly likely to cause the weld line depending on the shape of a molded article. Furthermore, the thermoplastic resin compositions can also be applied to other molding methods in the melt molding, that is, film formation such as extrusion molding, compression molding, blow molding, vacuum molding, film molding with the use of a T-die, and inflation molding, as well as melt spinning.

Among these types of melt molding, injection molding is preferable since molded articles in a variety of shapes and/or in relatively complex shapes can be obtained. The injection molding is also advantageous in terms of high productivity. Furthermore, the injection molding remarkably causes weld lines with merging of a molten resin in the cavity as already described, and thus can further obtain the advantageous effects of the present invention.

In a case where the thermoplastic resin composition according to the present invention is obtained as the composition pellet described above, injection molding with the use of the composition pellet will be described in detail. First, the flow beginning temperature FT (° C.) of the composition pellet was obtained. The flow beginning temperature refers to a temperature at which the composition pellet is molten in a plasticizing unit of an injection molder, and normally represents the flow beginning temperature of the thermoplastic resin composition itself. The flow beginning temperature is a temperature at which the melt viscosity represents 4800 Pa·s (4800 poises) when a capillary rheometer including a nozzle with an internal diameter of 1 mm and a length of 10 mm is used to extrude a heated melt from the nozzle while raising the temperature of the heated melt at a rate of temperature rise of 4/° C. minute, under a load of 9.81 MPa (100 kgf/cm$^2$). This flow beginning temperature is well known as an indication representing a molecular weight in the technical field of liquid crystal polymers (see "Liquid Crystal Polymer—Synthesis/Molding/Application—", edited by Naoyuki KOIDE, pp. 95-105, CMC, published on Jun. 5, 1987). In the present invention, a flow characteristics evaluation apparatus "Flow Tester—CFT-500D" manufactured by Shimadzu Corporation is used as an apparatus for measuring the flow beginning temperature.

As preferred injection molding, there is a method in which a composition pellet is molten at a temperature of [FT]° C. or more and [FT+100]° C. or less (resin melt temperature) with respect to the flow beginning temperature FT (° C.) of the composition pellet to obtain a melt, and the melt is injected into a mold set at a temperature of 0° C. or more. It is preferable to dry the composition pellet sufficiently prior to injection molding.

If the resin melt temperature is lower than FT (° C.), the composition pellet is not able to be molten sufficiently. Therefore, the flowability of the melt is lowered, leading to an unfavorable tendency to make it difficult to obtain a molded article in a microscopic shape, or provide insufficient transfer onto the mold surface, resulting in a rough molded article surface. On the other hand, if the resin melt temperature is higher than [FT+100]° C., the thermoplastic resin in the composition pellet is decomposed in the course of molding, with the unfavorable result that a molded article obtained has an abnormality caused in its swollen appearance, or that the gasification of the decomposition product from the thermoplastic resin is caused to easily generate degassing. Furthermore, if the resin melt temperature is higher than [FT+100]° C., adverse effects such as the molten resin flowing out from the nozzle are easily produced when, after injection molding, the mold is opened to take out a molded product. Thus, there is also a fear that the productivity itself of the molded article will be decreased. In view of the stability and moldability (productivity) of the molded article, the resin melt temperature is preferably [FT+10]° C. or more and [FT+80]° C. or less, and more preferably [FT+15]° C. or more and [FT+60]° C. or less.

In addition, while the mold temperature is normally set at 0° C. or more as described above, the mold temperature is determined in consideration of the size, mechanical properties and processability of the molded article obtained, and productivity such as molding cycle. In view of this requirement, the mold temperature is preferably 40° C. or more. If the mold temperature falls below 40° C., the control of the mold temperature may be likely to be made difficult in the case of continuous molding, and the variation in the temperature will be caused, thereby adversely affecting a molded article obtained. More preferably, the mold temperature is 70° C. or more. If the mold temperature falls below 70° C., the surface smoothness of the molded article obtained may be damaged. In terms of more favorable surface smoothness, the higher mold temperature is more advantageous. However, if the mold temperature is too high, the cooling effect will be decreased to increase the period of time required for the cooling step, thereby unfavorably resulting in problems such as decrease in productivity or deformation of a molded article due to decrease in releasability. Moreover, if the mold temperature is increased too much, the molds will provide poor engagement with each other, also increasing the risk of breakage of the molds themselves during opening or closing of the molds. It is also preferable to appropriately optimize the upper limit of the mold temperature, depending on the type of the composition pellet applied, in order to prevent decomposition of the thermoplastic resin included in the composition pellet. When the thermoplastic resin to be used is a preferred liquid crystal polymer, in particular, an entirely aromatic liquid crystal polyester, the mold temperature is preferably 70° C. or more and 220° C. or less, and more preferably 130° C. or more and 200° C. or less.

The mechanism of reducing the weld line through the use of the aggregated particles in the thermoplastic resin composition according to the present invention is not necessarily clear in the injection molding as described above. However, the present inventors have estimated as follows. A portion of the cavity where a molten resin merges, which is a generating factor of weld lines, will be herein referred to as a "weld portion".

When the thermoplastic resin is molten to form a molten resin, followed by injection molding of this molten resin, the molten resin of the thermoplastic resin will be subjected to shearing in the mold surface to be considerably oriented, resulting in an anisotropic shrinkage. On the other hand, since the resin flowing in the cavity fills the cavity while being cooled, increase in viscosity and solidification behavior are considered to occur in the weld portion. Therefore, the thermoplastic resin associated in the weld portion is not likely to provide entanglement of molecular chains, and has a higher tendency to solidify with the orientation of the flowing left, and this phenomenon is considered as a cause for weld lines. In particular, liquid crystal polymers have features such as molecular chains themselves strongly oriented, and a higher cooling solidification rate on the one hand and longer relaxation time on the other hand, and thus have the tendency which is particularly strong. In contrast, the thermoplastic resin composition including the aggregated particles lacks anisotropy due to three-dimensional entanglement of anisotropic fibrous crystals, and has a distinctive structure in which the aggregated particles are aggregation of fibrous crystals (secondary particles). Thus, the effect of highly inhibiting shear-induced orientation of the molten resin flowing in the cavity during molding and the entanglement of the aggregated particles in the weld portion for association of the molten resin are estimated to cause any weld line to be absent. Furthermore, it has been found that some of the aggregated particles are released from the aggregation state to be fibrous crystals in the course of injection molding. It is believed that the coexistence of the aggregated particles and the fibrous crystals as described above also contributes to reduce the weld line.

While the aggregated particles in the thermoplastic resin composition according to the present invention can successfully reduce weld lines in molded articles, the properties of the molded articles themselves, such as mechanical strength and heat resistance, are not significantly damaged when the molded article with the use of the aggregated particles is compared with the molded articles without the use of the aggregated particles. Therefore, the aggregated particles can successfully reduce a generation of weld line while maintaining the properties of the thermoplastic resin itself.

Furthermore, the result of the study by the present inventors has found that when a liquid crystal polymer is used as the thermoplastic resin, surface peeling is significantly suppressed, which is one problem with a molded article obtained by injection molding the liquid crystal polymer. More specifically, the molded article configured with the use of the liquid crystal polymer normally has a tendency to have a characteristic layer referred to as a skin layer formed at the surface thereof. In this skin layer, a liquid crystal polymer has particularly strong orientation, and fibrous fibrils (surface peeling) may occur with only weak rubbing. Such surface peeling can be determined by, for example, a tape peeling test. To briefly describe this tape peeling test, the operation of putting and peeling a tape on the surface of a molded article is repeated a predetermined number of times, and when the portion on which the tape is put and from which the tape is peeled can be visually determined, it is determined that surface peeling has been caused. It has been found that molded articles obtained through the use of the liquid crystal polymer and the aggregated particles in the thermoplastic resin composition according to the present invention have such surface peeling considerably suppressed. It is estimated that this advantageous effect is produced because three-dimensional entanglement of the aggregated particles at the surface of the molded article is exposed at the surface of the molded article to produce a so-called anchor effect, thereby improving the durability against surface peeling, in particular, the resistance against peeling in the tape peeling test.

<Applications of Molded Articles>

The thermoplastic resin compositions according to the present invention are preferred for electric and electronic components, optical components, etc., as previously described. The electric and electronic components, optical components include, for example, components associated with semiconductor production processing such as connectors, sockets, relay components, coil bobbins optical pickups, oscillators, printed wiring boards, circuit boards, semiconductor packages, components associated with a computer, lens tubes of cameras, optical sensor housings, compact camera module housings (packages and lens tubes), projector optical engine constructional elements, IC trays, and wafer carriers; home electric appliance components such as VTR, televisions, irons, air conditioners, stereos, vacuum cleaners, refrigerators, rice cookers, and lighting equipments; lighting equipment components such as lamp reflectors and lamp holders; acoustic product components such as compact discs, laser discs, and speakers; and communication equipment components such as ferrules for optical cables, telephone components, facsimile components, and modems.

Furthermore, the thermoplastic resin compositions can be used for other applications, that is, copying machine and components associated with a printer such as separating claws and heater holders; machine components such as impellers, fan gears, gears, bearings, motor components and cases; automobile components such as mechanical components for automobiles, engine components, components in engine rooms, illumination components, and interior components; cooking equipments such as microwave pans for cooking and heat insulating utensils; heat insulating and acoustic insulating materials such as floor covering materials and wall materials, supporting materials such as beams and posts, construction materials such as roofing materials, or materials for civil engineering and construction; components for aircraft, spacecraft, space appliances; members for radiation facilities such as nuclear reactors; members for marine facilities; jigs for cleaning; components for optical instruments; valves; pipes; nozzles; filters; films; medical equipment components and medical materials; components for sensors; sanitary items; sporting goods; and leisure goods.

While the resin molded articles according to the present invention can be used for a variety of applications, the molded articles are preferred for particularly appearance-critical components and optical components requiring an even reflection behavior because the molded articles eliminate weld lines to be absent. Furthermore, the molded articles are excellent in the resistance against peeling in the tape peeling test, and thus preferred for contact components (switches and relays), optical sensor components, and camera components in which particles missing from the molded articles will be problematic from the viewpoint of reliability.

The invention being thus described, it will be apparent that the same may be varied in many ways. Such variations are to be regarded as within the spirit and scope of the invention, and all such modifications as would be apparent to one skilled in the art are intended to be within the scope of the following claims.

EXAMPLES

The present invention is described in more detail by following Examples, which should not be construed as a limitation upon the scope of the present invention.

Method for Determining Presence or Absence of Weld Line:

FIG. 1 schematically shows the shape of a molded article (a test specimen for weld line determination, external dimensions: 64×64×3 mm, with a 6 mmφ hallow portion in a central portion) used for determining the presence or absence of a weld line. Furthermore, in FIG. 1, the direction of a molten resin flow obtained when this test specimen for weld line determination is molded by injection molding is indicated by arrows. A weld line (referred to as a "weld" in FIG. 1) appears in a merging portion (weld portion) of this molten resin. The presence or absence of this weld line was visually observed to determine the presence or absence thereof. Furthermore, when no weld line was observed, the presence or absence of a flow mark due to the resin flow was also visually observed.

Tape Peeling Test:

A test specimen for a tape peeling test with external dimensions of 64×64×1 mm was molded by injection molding. For this test specimen for a tape peeling test, a series of operation was repeatedly carried out thirty times, in such a way that Sellotape (registered trademark) CT-18 manufactured by Nichiban Co. Ltd. for molding the test specimen was put over the entire length of the test specimen along the flow direction of a standard test specimen and a direction perpendicular to the flow direction, and peeled off quickly. In this test, the tape peels a resin composition on the surface of the test specimen, resulting in fibrillation (feathering). Peeling of fibrous fibrils at the surface of the tested test specimen was visually confirmed, and the degree of the peeling was determined.

Specific Gravity:

An ASTM No. 4 dumbbell (specific gravity test specimen) was molded by injection molding, and measured for its specific gravity in accordance with ASTM D792. A test specimen of 64×64×15 mm in thickness and a test specimen with a length of 127 mm, a width of 12.7 mm, and a thickness of 6.4 mm were injection molded instead of the ASTM No. 4 dumbbell, and measured for their specific gravities, the results were nearly equivalent to those of the ASTM No. 4 dumbbell. Therefore, the test result of ASTM No. 4 dumbbell will be representatively shown in this example.

Bending Properties:

A test specimen with a length of 127 mm, a width of 12.7 mm, and a thickness of 6.4 mm was molded by injection molding, and the three-point bending strength of the test specimen was measured under measurement conditions in accordance with ASTM D790 with the use of Tensilon UTM-500 manufactured by A&D.

Deflection Temperature Under Load:

A test specimen with a length of 127 mm, a width of 12.7 mm, and a thickness of 6.4 mm was molded by injection molding, and the deflection temperature under load of the test specimen was measured under measurement conditions in accordance with ASTM D648.

Production Example 1

Production of Liquid Crystal Polymer

To a reactor equipped with a stirrer, a torquemeter, a nitrogen gas introduction tube, a thermometer, and a reflux cooler, 994.5 g (7.2 mol) of para-hydroxybenzoic acid, 446.9 g (2.4 mol) of 4,4'-dihydroxybiphenyl, 299.0 g (1.8 mol) of terephthalic acid, 99.7 g (0.6 mol) of isophthalic acid, 1347.6 g (13.2 mol) of acetic anhydride, and 0.194 g of 1-methylimidazole were added, the inside of the reactor was sufficiently replaced by a nitrogen gas through stirring at room temperature for 15 minutes, and the temperature was then raised while stirring. When the inside temperature reached 145° C., stirring was carried out for 1 hour with the temperature kept. Then, the temperature was raised up to 320° C. over 2 hours and 50 minutes while distilling away by-product acetic acid and unreacted acetic anhydride, and the point at which an increase in torque was recognized was regarded as completion of the reaction, thereby obtaining a prepolymer. The flow beginning temperature of the prepolymer was 261° C.

The obtained prepolymer was cooled to room temperature and ground with a coarse grinder to obtain powder (the particle size from about 0.1 mm to about 1 mm) of the liquid crystal polyester. Then, solid phase polymerization was carried out by raising the temperature from room temperature to 250° C. over 1 hour, raising the temperature from 250° C. to 285° C. over 5 hours, and keeping the temperature at 285° C. for 3 hours under a nitrogen atmosphere. The flow beginning temperature of the obtained liquid crystal polyester was 327° C. The thus obtained liquid crystal polyester is referred to as LCP1.

<Aggregated Particles>

The following particles were used as the aggregated particles.

Xonotlite Powder XK manufactured by Japan Insulation Co., Ltd.

Mean Particle Size (Laser Diffraction Method): 30 μm
    Packing Density (JIS K1464): 0.084 g/cc
    Oil Absorption (JIS K5101): 492 ml/100 g
    Specific Surface Area (BET method): 56 m$^2$/g (These properties of the aggregated particles are based on catalog data from Japan Insulation Co., Ltd.)

Examples 1 and 2

Comparative Example 1

The LCP1 obtained in Production Example 1, the aggregated particles (Xonotlite Powder XK), a glass fiber (EFH75-

01 manufactured by Central Glass Co., Ltd.), and carbon black (Carbon Black CB #45 manufactured by Mitsubishi Chemical Corporation) with compositions shown in Table. 1 were pelletized at a cylinder temperature of 340° C. with the use of a twin-screw extruder (PCM-30 manufactured by Ikegai Iron Wordks, Co., Ltd.), thereby obtaining liquid crystal polymer composition pellets. In this case, a portion of the Xonotlite Powder XK (about 30% by weight with respect to the total usage of the Xonotlite Powder XK) was mixed with the LCP1 in advance with the use of a Henschel mixer, and the mixture, the rest of the Xonotlite Powder XK, the glass fiber, and the carbon black were molten and kneaded with the twin-screw extruder.

For the obtained composition pellets, the weight of 100 grains was measured. The weight measurement for each composition pellet was made ten times, and the dispersibility was evaluated from the highest value, lowest value, and standard deviation of the weight measurement. The results are shown in Table 2.

For the obtained composition pellets, the flow beginning temperature (FT: flow temperature) was measured, and in accordance with the methods previously described, the specific gravity, mold shrinkage factor, bending properties, and deflection temperature under load were measured. After drying the composition pellets obtained as described above, test specimens in accordance with the various types of tests were obtained by injection molding with the use of a PS40E-5ASE type injection molder manufactured by Nissei Plastic Industrial Co., Ltd. The results are shown in Table 3.

Furthermore, it was determined whether or not the molded articles obtained had a weld line. The results are shown in Table 4.

TABLE 1

|  | Comparative Example 1 | Example 1 | Example 2 |
| --- | --- | --- | --- |
| LCP/parts by weight | 100 | 100 | 100 |
| EFH75-01/parts by weight | 42.8 | 38.5 | 35.7 |
| CB#45/parts by weight | 1.4 | 1.4 | 1.4 |
| Xonotlite Powder XK/parts by weigh | 0 | 4.3 | 7.1 |

TABLE 2

|  | Highest Value (g) | Lowest Value (g) | Standard Deviation | Dispersibility |
| --- | --- | --- | --- | --- |
| Example 1 Weight of 100 grains (10 times measurements) | 1.16 | 1.14 | 0.01 | favorable |
| Example 2 Weight of 100 grains (10 times measurements) | 1.27 | 1.23 | 0.02 | favorable |

TABLE 3

|  |  | Comparative Example 1 | Example 1 | Example 2 |
| --- | --- | --- | --- | --- |
| Specific Gravity |  | 1.61 | 1.61 | 1.61 |
| Mold Shrinkage Factor | MD % | 0.19 | 0.19 | 0.19 |
|  | TD % | 1.14 | 1.17 | 1.15 |
| Bending Strength | MPa | 130 | 129 | 114 |
| Bending Elasticity | MPa | 8800 | 9900 | 9600 |
| Deflection Temperature under Load @1.82 MPa | ° C. | 250 | 247 | 245 |

TABLE 4

| Comparative Example 1 | Example 1 | Example 2 |
| --- | --- | --- |
| A weld line was clearly observed. | No weld line was observed. | None of weld lines and flow marks due to resin flow was observed. |

Example 3

Comparative Example 2

The thermoplastic resin compositions used in Example 2 and Comparative Example 1 were used to carry out a tape peeling test in accordance with the method already described. The results are shown in Table 5 as Example 3 for the result of a molded article obtained from the thermoplastic resin composition according to Example 2, and as Comparative Example 2 for the result of a resin molded article obtained from the thermoplastic resin composition according to Comparative Example 1.

TABLE 5

| Direction of Putting Tape | Comparative Example 2 | Example 3 |
| --- | --- | --- |
| Resin Flowing Direction during Molding in Resin Molded Article | Surface peeling (fibril) was clearly observed. | No surface peeling (fibril) was observed. |
| Direction Perpendicular to the Resin Molded Article | Surface peeling (fibril) was clearly observed. | No surface peeling (fibril) was observed. |

It was found that the thermoplastic resin composition (liquid crystal polymer composition) according to the present invention, that is, the thermoplastic resin composition (liquid crystal polymer composition) including aggregated particles (Xonotlite Powder XK) obtained by aggregation of fibrous crystals adequately reduce weld lines, even when molded articles were obtained by injection molding. Furthermore, this thermoplastic resin composition (liquid crystal polymer composition) successfully suppresses surface peeping (fibril), even when the tape peeling test was carried out. Therefore, molded articles obtained with the use of the thermoplastic resin composition according to the present invention are quite useful for not only appearance-critical molded articles such as cases and housings, but also optical components such as lens tubes of cameras and optical sensor housings, in which uneven reflection at the surface and foreign matters produced due to surface peeling, etc. are problematic.

What is claimed is:

1. A thermoplastic resin composition comprising a thermoplastic resin and aggregated particles of fibrous crystals having a three-dimensional entanglement structure, wherein the aggregated particles are contained in an amount of 0.1 part by weight to 150 parts by weight with respect to 100 parts by weight of the thermoplastic resin.

2. The thermoplastic resin composition according to claim 1, wherein the fibrous crystals are silicate fibrous crystals.

3. The thermoplastic resin composition according to claim 2, wherein the fibrous crystals are calcium silicate fibrous crystals.

4. The thermoplastic resin composition according to claim 3, wherein the fibrous crystals are Xonotlite crystals.

5. The thermoplastic resin composition according to claim 1, wherein the thermoplastic resin is a liquid crystal polymer.

6. A method for producing a thermoplastic resin composition comprising a thermoplastic resin and aggregated particles of fibrous crystals having a three-dimensional entanglement structure, wherein the aggregated particles are contained in an amount of 0.1 part by weight to 150 parts by weight with respect to 100 parts by weight of the thermoplastic resin, the method comprising the steps of:
   mixing a thermoplastic resin with a partial aggregated particles of fibrous crystals to obtain a mixture;
   adding the rest of the aggregated particles to the mixture; and
   melting, kneading and extruding the resulting mixture so as to provide the thermoplastic resin composition.

7. A molded article obtained by melt-molding the thermoplastic resin composition according to claim 1.

* * * * *